US012651109B1

(12) United States Patent　　　　　(10) Patent No.:　US 12,651,109 B1

Chapman et al.　　　　　　　　　　　(45) Date of Patent:　　Jun. 9, 2026

(54) HYBRID TIMING WINDOWS IN CLOCK TREE SYNTHESIS

(71) Applicant: Cadence Design Systems, Inc., San Jose, CA (US)

(72) Inventors: Andrew Mark Chapman, Milton (GB); Michael Alexander, Graham, WA (US); Natarajan Viswanathan, Austin, TX (US); Andrew Hall, Cambridge (GB)

(73) Assignee: Cadence Design Systems, Inc., San Jose, CA (US)

( * ) Notice: Subject to any disclaimer, the term of this patent is extended or adjusted under 35 U.S.C. 154(b) by 593 days.

(21) Appl. No.: 18/348,103

(22) Filed: Jul. 6, 2023

(51) Int. Cl.
　　G06F 30/392　　　　(2020.01)
(52) U.S. Cl.
　　CPC ................................... G06F 30/392 (2020.01)
(58) Field of Classification Search
　　CPC ....................................................... G06F 30/392
　　See application file for complete search history.

(56) References Cited

U.S. PATENT DOCUMENTS

| | | | |
|---|---|---|---|
| 6,401,231 B1 * | 6/2002 | Belkhale | ............. G06F 30/3312 |
| | | | 716/108 |
| 10,614,261 B1 * | 4/2020 | Alexander | ............ G06F 30/396 |
| 2023/0376670 A1 * | 11/2023 | Huang | ................ G06F 30/3315 |

* cited by examiner

*Primary Examiner* — Nghia M Doan

(74) *Attorney, Agent, or Firm* — Schwegman Lundberg & Woessner, P.A.

(57) ABSTRACT

A hybrid window scheme for defining timing windows during CTS. CTS is performed to generate an intermediate clock tree including a respective insertion delay for each of the one of more flip-flops. A set of clock timing constraints is generated for the plurality of slack values of each flip-flop such that every positive slack value of the plurality of slack values is prevented from becoming negative, a lowest negative slack value of the one or more negative slack values is prevented from becoming lower, and every negative slack value of the one or more negative slack values having a higher value than the lowest negative slack value is prevented from becoming lower than the lowest negative slack value but is allowed to become lower than its current value. A second iteration of CTS is performed, constrained by the clock timing constraints, resulting in an enhanced clock tree.

20 Claims, 14 Drawing Sheets

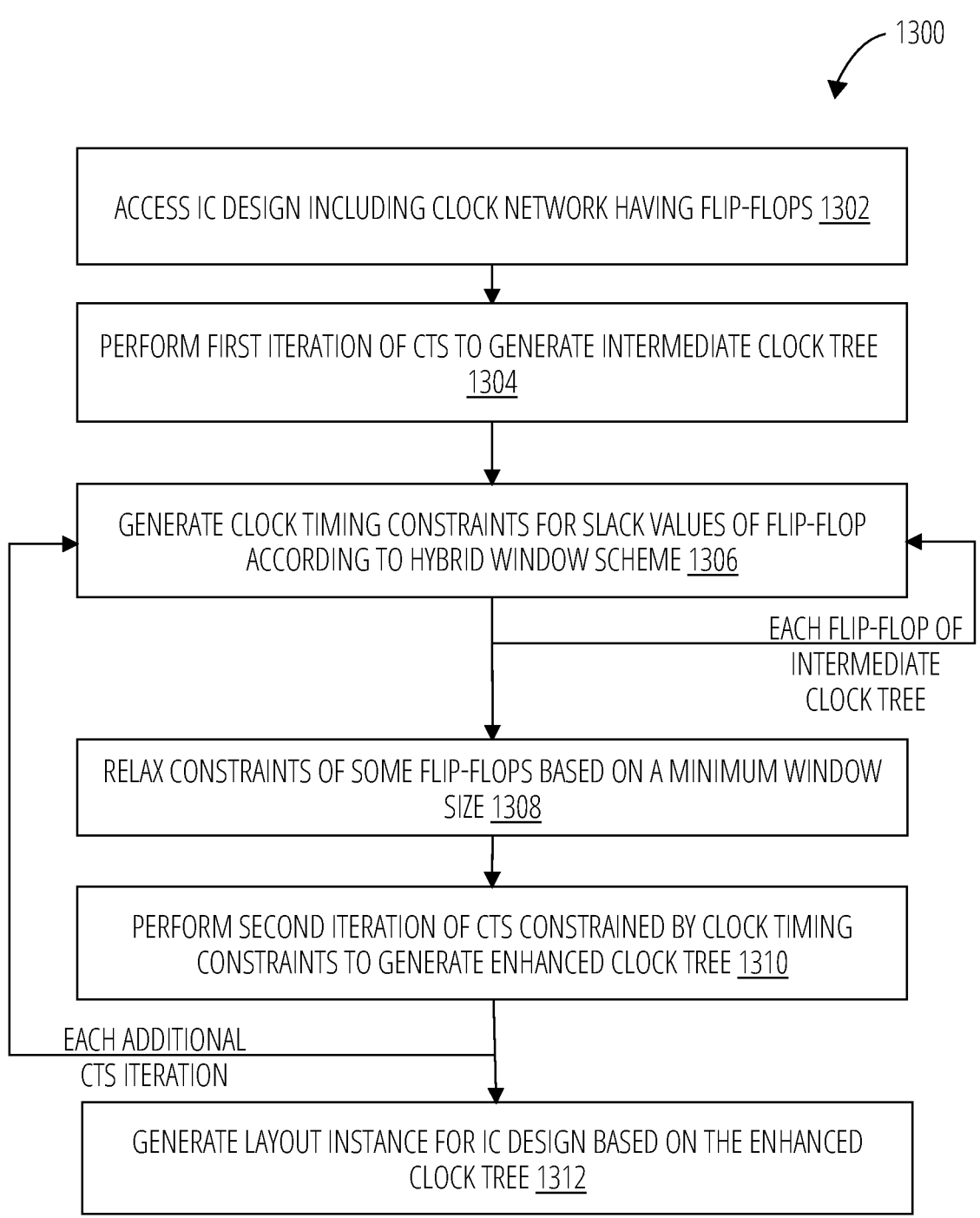

1300

ACCESS IC DESIGN INCLUDING CLOCK NETWORK HAVING FLIP-FLOPS 1302

PERFORM FIRST ITERATION OF CTS TO GENERATE INTERMEDIATE CLOCK TREE 1304

GENERATE CLOCK TIMING CONSTRAINTS FOR SLACK VALUES OF FLIP-FLOP ACCORDING TO HYBRID WINDOW SCHEME 1306

EACH FLIP-FLOP OF INTERMEDIATE CLOCK TREE

RELAX CONSTRAINTS OF SOME FLIP-FLOPS BASED ON A MINIMUM WINDOW SIZE 1308

PERFORM SECOND ITERATION OF CTS CONSTRAINED BY CLOCK TIMING CONSTRAINTS TO GENERATE ENHANCED CLOCK TREE 1310

EACH ADDITIONAL CTS ITERATION

GENERATE LAYOUT INSTANCE FOR IC DESIGN BASED ON THE ENHANCED CLOCK TREE 1312

FIG. 13

HYBRID TIMING WINDOWS IN CLOCK TREE SYNTHESIS

TECHNICAL FIELD

The present disclosure generally relates to the technical field of integrated circuit design. In particular, the present disclosure addresses a clock tree synthesis process that uses hybrid timing windows.

BACKGROUND

An integrated circuit (IC) layout specifies portions of various components of an IC device. When the IC is to include cells, macros, and/or other types of clocked devices ("sinks") that are to be clocked, the IC includes one or more clock networks for delivering a clock signal from a clock source to all of the components to be clocked by it. A clock network distributes a clock signal from its root (e.g., a clock source) to sinks (e.g., macros or flip flops) within an IC through a branching network of drivers (e.g., buffers or inverters).

Electronic design automation (EDA) software systems commonly perform clock-tree synthesis (CTS). Conventional approaches to CTS include building a clock tree by placing drivers at various regions of the clock network based on satisfaction of a set of clock tree design constraints that include timing constraints, such as clock slew and clock latency. Clock skew refers to a difference in clock arrival time between two clock sinks.

BRIEF DESCRIPTION OF THE SEVERAL VIEWS OF THE DRAWINGS

In the drawings, which are not necessarily drawn to scale, like numerals may describe similar components in different views. To easily identify the discussion of any particular element or act, the most significant digit or digits in a reference number refer to the figure number in which that element is first introduced. Some non-limiting examples are illustrated in the figures of the accompanying drawings in which:

FIG. 13 is a flow chart illustrating operations of a method of CTS using hybrid timing windows, according to some examples.

DETAILED DESCRIPTION

Figure 1:
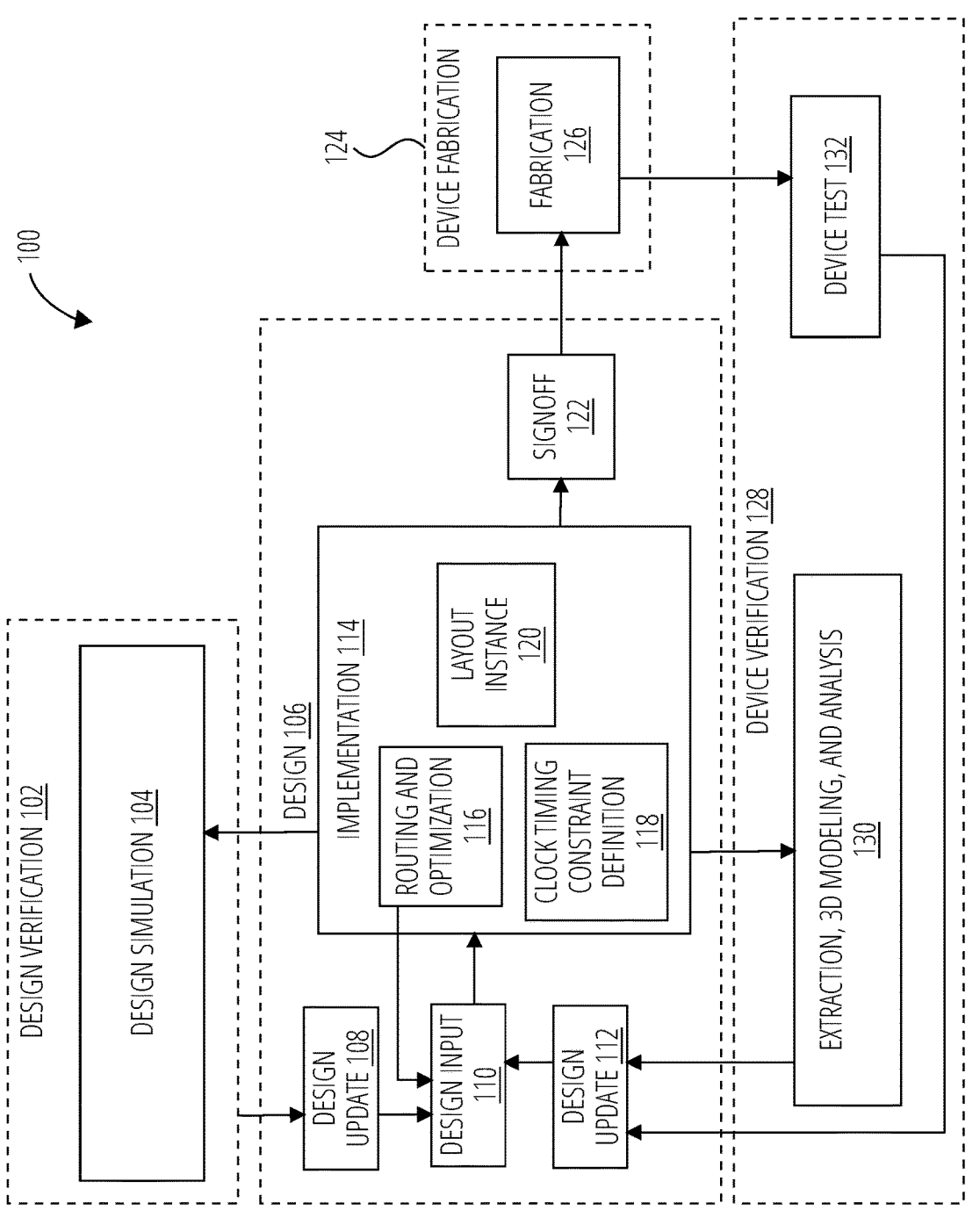
FIG. 1 illustrates an example design process flow for circuit design, according to some examples.

Examples described herein may provide methods, systems, and computer readable media for CTS using a hybrid window scheme for defining timing windows during CTS.

In some instances, clock skew may be intentionally added into a clock tree. For example, during CTS, a clock path delay for each clock sink is tuned in accordance with design constraints. Prior to tuning clock path delays, a pin insertion delay (PID) can be assigned to a clock path and provided as a constraint to CTS. PID is a virtual delay added to a clock path of the IC design that causes CTS to intentionally introduce skew when tuning clock path delays. PID may also be referred to as the "insertion delay" of a local clock signal used to clock a clock sink.

CTS is typically conducted as an iterative process: an initial clock tree is synthesized, timing constraints for the various clock sinks are defined (potentially along with other design constraints), and a set of optimization operations are performed within these constraints. A further clock tree is then synthesized based on the optimization operations, followed by constraint-setting and optimization, and the process iterates until a final clock tree design is generated. With respect to a given iteration, the starting clock tree may be referred to as an "intermediate clock tree", and the resulting clock tree may be referred to as an "enhanced clock tree". The iterative CTS process of synthesis, constraint-setting, and optimization may be referred to herein as clock optimization, clock tree optimization, or CTS.

Timing windows can be used to define the clock timing constraints of clock sinks following the synthesis stage and prior to the optimization stage of a given iteration of CTS. Various approaches to timing windows may be used, such as a total negative slack (TNS) timing window scheme or a worst negative slack (WNS) timing window scheme, both of which are described below and both of which have various advantages and disadvantages. The various example hybrid window schemes described herein may attempt to address the technical problems posed by the use of timing window schemes such as TNS or WNS by leveraging some of the strengths of each scheme and/or mitigating some of the limitations thereof.

In the context of IC design, "slack" refers to a difference between a required time and an arrival time of a signal. A negative setup slack refers to a signal in which the arrival time is after the required time (e.g., at the endpoint of a path where a data signal is captured). A negative hold slack refers to a signal of the next cycle arriving before the signal of the current cycle has been captured. Thus, in IC design, a clock sink with either negative setup slack or negative hold slack typically indicates a clock tree problem that needs to be solved through further clock tree optimization.

In contrast, positive setup slack or positive hold slack typically represents a resource that affords a certain amount of freedom in adjusting the clock tree to address negative slack problems elsewhere in the design. Positive slack can also indicate a margin within which power usage may be reduced.

FIG. 1 is a diagram illustrating an example design process flow 100 for generating a clock tree with buffers and inverters, according to some embodiments. As shown, the design process flow 100 includes a design phase 106, a device fabrication phase 124, a design verification phase 102, and a device verification phase 128. The design phase 106 involves an initial design input 110 operation where the basic elements and functionality of a device are determined, and revisions are made based on various analyses and optimization of a circuit design. This design input 110 operation is where block instances are used in the circuit design and any additional circuitry for the design around the blocks is selected. The initial strategy, tactics, and context for the device to be created are also generated in the design input 110 operation, depending on the particular design algorithm to be used.

In some embodiments, following an initial selection of design values in the design input 110 operation, routing, timing analysis, and optimization are performed in an implementation operation 114, which includes an optimization 116 operation, an operation 118 for defining clock timing constraints in accordance with examples described herein, and generating a layout instance 120, along with any other automated design processes. Optimization 116 may occur prior to the layout instance 120, and routing, timing analysis, and optimization 116 may be performed at any time to verify operation of a circuit design. For instance, in various embodiments, timing analysis in a circuit design may be performed prior to routing of connections in the circuit design, after routing, during register transfer level (RTL) operations, or as part of a signoff 122, as described below.

Though not shown, the routing and optimization 116 operation can include a clock tree synthesis (CTS) operation, which can generate one or more clock trees that deliver clock signal from clock sources of a circuit design to a plurality of clock tree leaf nodes comprising clock tree sinks (e.g., flip-flops) within the circuit design. The routing and optimization 116 operation may also include other operations not shown, such as those relating to floorplanning, placement, post-placement optimization, and post-routing optimization. As shown, the routing and optimization 116 operation includes the operation 118 for defining clock timing constraints. Operation 118 may be performed after a CTS operation, as described in greater detail below.

Design inputs are used in the design input 110 operation. These may be further processed during the design input 110 operation via a process, such as logic-synthesis to generate a circuit netlist mapped to a target standard library manufacturable by the foundry in fabrication operation 126. This netlist is placed by the layout instance 120 and optimized and routed by operation 116, and a clock tree is inserted by a CTS process. Operations 116, 118, and 120 may have a close interrelation and may be simultaneously optimized by processes similar to CCOPT. Prior to the routed, placed and optimized netlist being provided to a fabrication operation 126, the signoff 122 is performed on the circuit design defined by the layout.

After signoff verification by the signoff 122, a verified version of the layout is used in the fabrication operation 126 to generate a device, or additional testing and design updates may be performed using designer inputs or automated updates based on design simulation 104 operations or extraction, 3D modeling, and analysis 130 operations. Once the device is generated, the device can be tested as part of device test 132 operations, and layout modifications generated based on actual device performance.

As described in more detail below, a design update 108 from the design simulation 104; a design update 108 from the device test 132 or the extraction, 3D modeling, and analysis 130 operations; or from the design input 110 operation may occur after the initial layout instance 120 is generated. In various embodiments, whenever design inputs are used to update or change an aspect of a circuit design, a timing analysis and the routing and optimization 116 operation may be performed.

Figure 2:
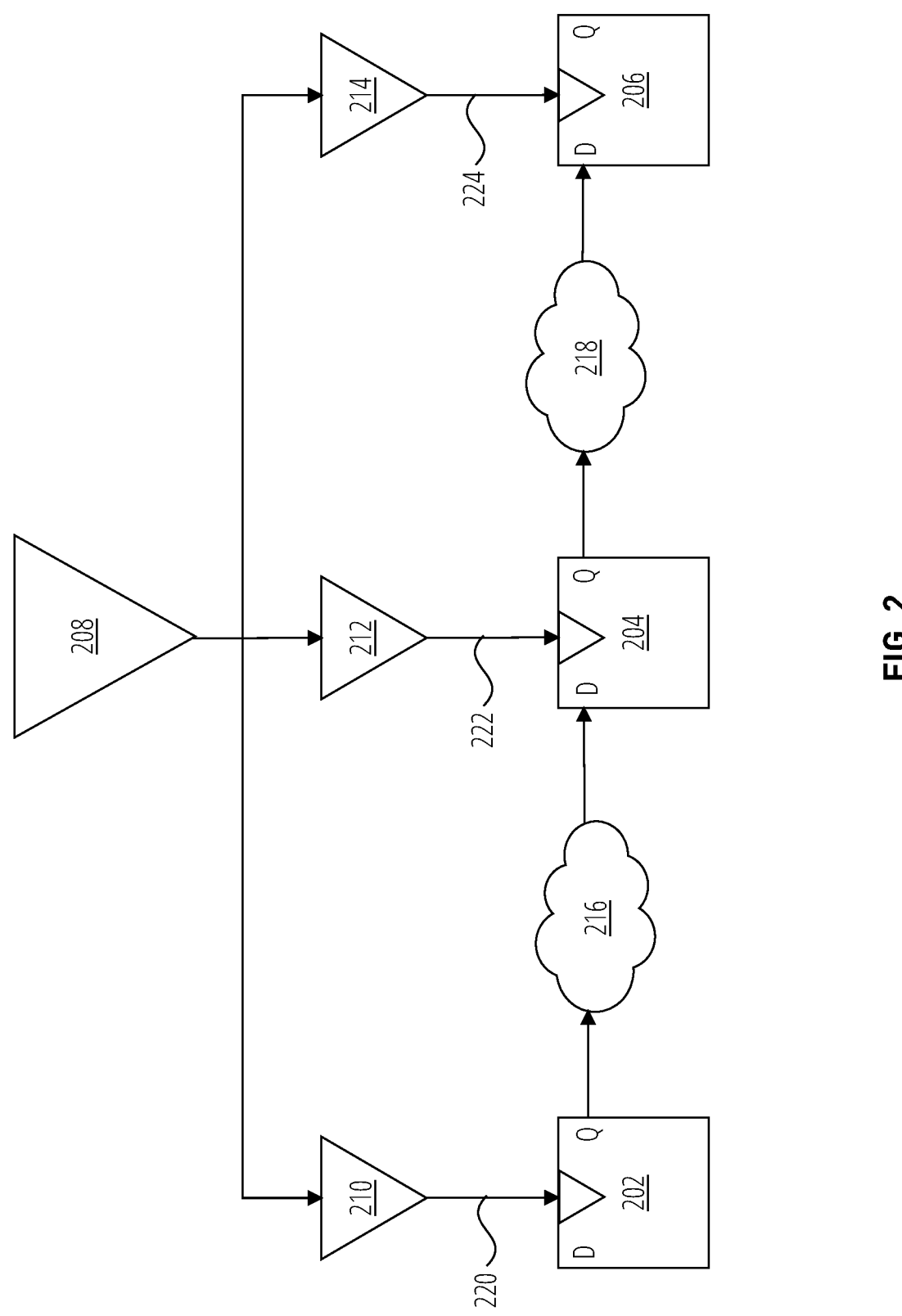
FIG. 2 illustrates an example clock with three sinks shown as flip-flops, in accordance with some examples.

FIG. 2 shows an example of a clock 208 with three sinks shown as first flip-flop 202, second flip-flop 204, and third flip-flop 206. The clock 208 follows a separate clock path to each flip-flop, each of which may introduce a different delay, shown as first delay 210, second delay 212, and third delay 214. The resulting three clock signals arriving at the three flip-flops are denoted first local clock 220, second local clock 222, and third local clock 224, respectively.

The output ("Q") of the first flip-flop 202 passes through a first datapath 216 before arriving at the input ("D") of the second flip-flop 204; thus, the first local clock 220 acts as a launch clock for first datapath 216, and the second local clock 222 acts as a capture clock for first datapath 216. The output ("Q") of the second flip-flop 204 passes through a second datapath 218 before arriving at the input ("D") of the third flip-flop 206; thus, the second local clock 222 acts as a launch clock for second datapath 218, and the third local clock 224 acts as a capture clock for second datapath 218.

In this example, setup slack and hold slack of each flip-flop 202, 204, 206 are defined in relation to the latency of the local clocks 220, 222, 224 and the timing of the datapath 216, 218 between the flip-flops (as well as further datapaths and further local clocks prior to the first flip-flop 202 and/or after the third flip-flop 206). The second flip-flop 204 will be considered as an example of a clock sink constraining the optimization of clock timing.

In clock tree optimization, various metrics may be used when adjusting the latency of a local clock in order to satisfy the constraints imposed by the slack of the sinks of the local clock. Setup slack and hold slack can be calculated for both pins (input "D" and output "Q") of the second flip-flop 204, with the various slack values indicating constraints on the clock tree optimization process. Assuming fixed timing of the datapaths 216, 218, the second delay 212 introduced to second local clock 222 may be adjusted according to constraints imposed by these slack values. Specifically, the second delay 212 may be increased by the smaller of: the Q-pin setup slack, and the D-pin hold slack. Similarly, the second delay 212 may be decreased by the smaller of: the D-pin setup slack, and the Q-pin hold slack.

Thus, in one example, the D-pin of second flip-flop 204 has a setup slack of 7 picoseconds (ps) and a hold slack of 9 ps, and the Q-pin has a setup slack of 5 ps and a hold slack of 2 ps. In this example, the second delay 212 may be increased by up to 5 ps (e.g., min (5 ps, 9 ps)) or decreased by up to 2 ps (e.g., min (7 ps, 2 ps)). If these constraints on the second delay 212 are observed, the second flip-flop 204 will not suffer from any negative slack. These constraints on the second delay 212 defining second local clock 222 may be visualized as a timing window for second flip-flop 204.

Figure 3:
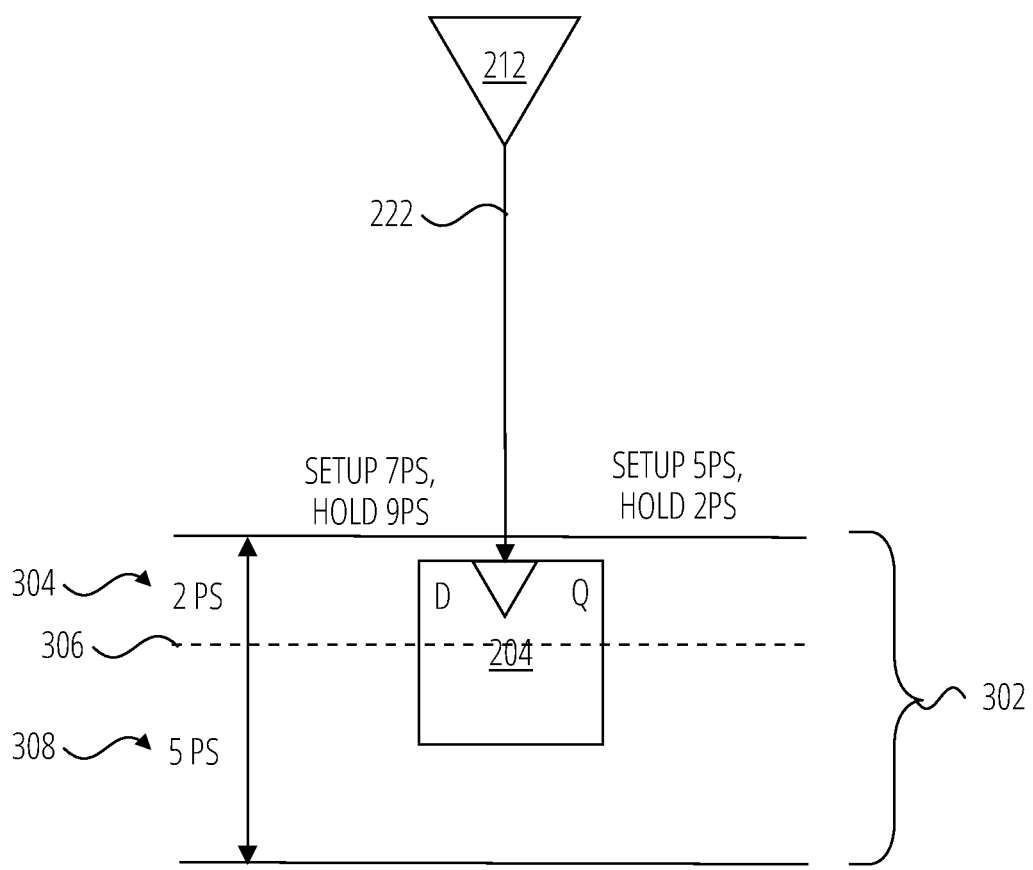
FIG. 3 illustrates a total negative slack (TNS) timing window of the flip-flop of FIG. 2, in accordance with some examples.

FIG. 3 shows a timing window of the second flip-flop 204 in accordance with the continuing example described above. The timing window 302 shows the maximum increase 304 (2 ps in this example) and maximum decrease 308 (5 ps in this example) relative to the current delay 306.

The timing window 302 is a visualization of a set of constraints imposed on a flip-flop or other clock sink during an iteration of CTS. The adjustments to clock timing during the optimization stage are made within the constraints imposed by the timing windows of the various components of the clock tree; thus, more tightly constrained timing windows result in less space to perform optimization adjustments, whereas loosely constrained timing windows provide more freedom to adjust clock delays and other design parameters during optimization.

Thus, the computation or generation of a timing window for a flip-flop or other clocked component represents the computation or generation of a set of clock timing constraints on the slack values of the flip-flop or other clocked component during an iteration of CTS.

It will be appreciated that the examples described above are only applicable to clock sinks with no negative slack. These examples assume that a flip-flop having no negative slack—and therefore not currently presenting a problem that needs to be fixed during clock tree optimization—should be maintained in its problem-free state while other changes are made to the IC design during clock tree optimization. The timing window 302 embodies this principle, by defining constraints within which the problem-free second flip-flop 204 will continue to be problem-free.

However, these assumptions and examples may need to be re-examined when encountering flip-flops having at least one currently negative slack value.

Figure 4:
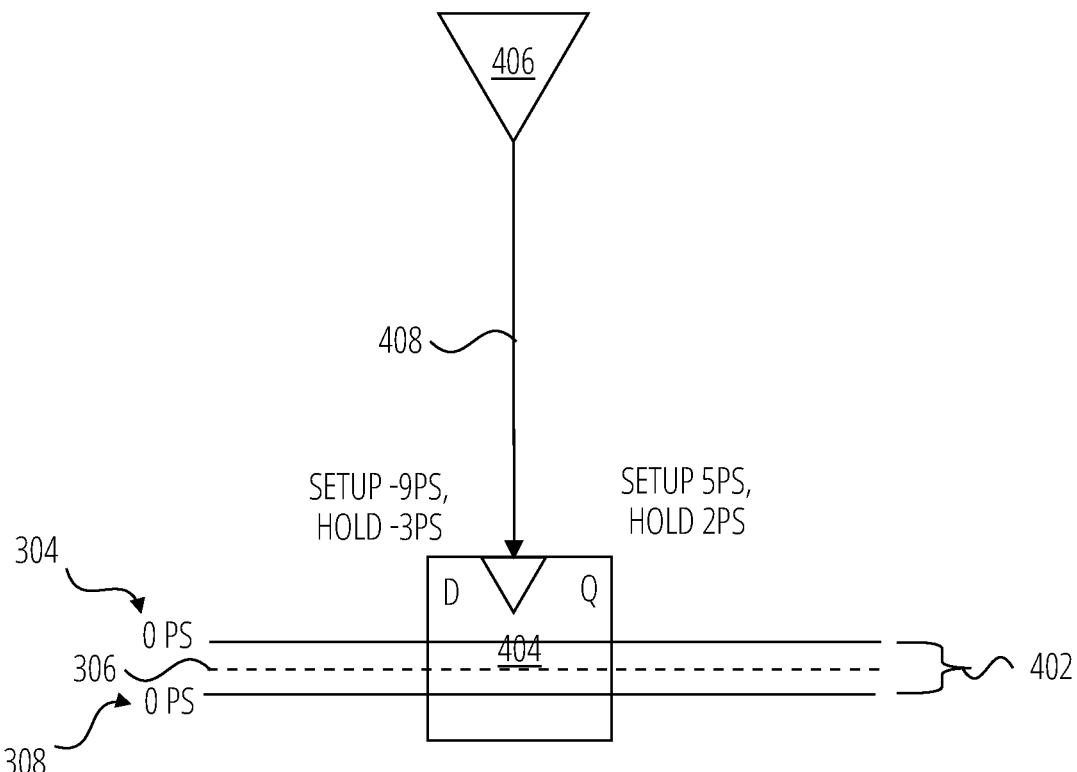
FIG. 4 illustrates a TNS timing window of a flip-flop having negative slack values, in accordance with some examples.

FIG. 4 shows a timing window 402 for a flip-flop 404 having multiple negative slack values. In this example, the D-pin of flip-flop 404 has a setup slack of −9 ps and a hold slack of −3 ps, and the Q-pin has a setup slack of 5 ps and a hold slack of 2 ps. In this example, the delay 406 defining local clock 408 may not be increased (e.g., min (5 ps, −3 ps)<0) or decreased (e.g., min (−9 ps, 2 ps)<0). Thus, the timing window 402 has a maximum increase 304 of 0 ps and a maximum decrease 308 of 0 ps relative to the current delay 306. The delay 406 cannot be changed in either direction without making one or the other negative slack problem of the flip-flop 404 worse.

The timing window 302 shown in FIG. 3 and the timing window 402 shown in FIG. 4 may be referred to herein as total negative slack (TNS) windows, because they seek to limit the total negative slack of the entire IC design (e.g., the sum of the negative slack of each clock sink of the design) by ensuring that the negative slack values of any given clock sink do not degrade past their current values (and that no new negative slack values are created).

It will be appreciated that the examples in FIG. 3 and FIG. 4 above define the TNS timing windows with reference only to the initial slack values of the flip-flop in question, without considering parameters of other components of the current IC design. However, other approaches can define timing windows based on overall attributes of the current IC design as a whole.

Figure 5:
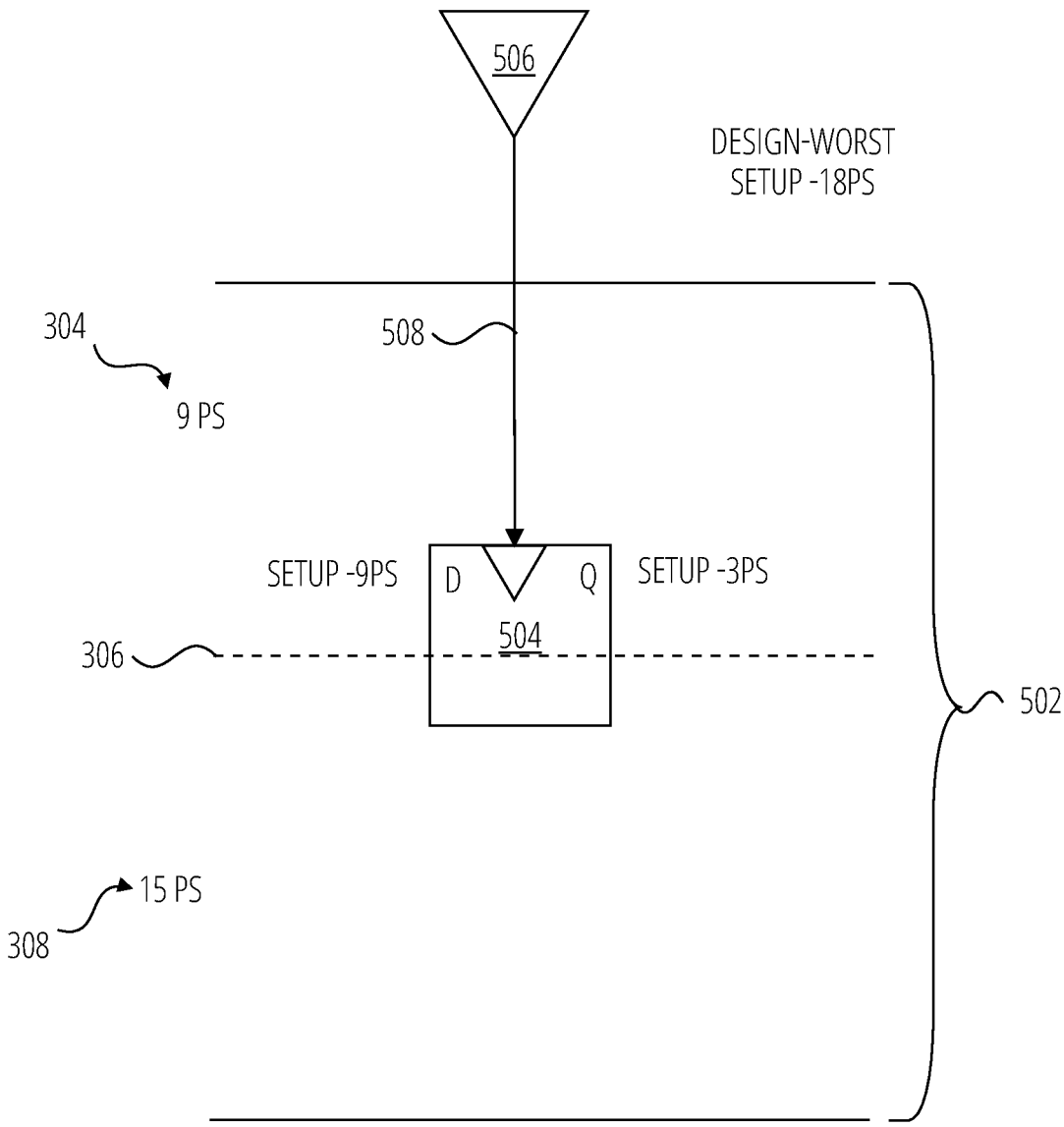
FIG. 5 illustrates a worst negative slack (WNS) timing window of a flip-flop, in accordance with some examples.

FIG. 5 shows a timing window 502 for a flip-flop 504 having a D-pin setup slack of −9 ps and a Q-pin setup slack of −3 ps, the timing window 502 being defined according to an approach that takes into account the worst setup slack value of any clock sink in the current IC design. The flip-flop 504 is clocked by local clock 508 defined by delay 506.

In this example, the timing window 502 is defined to prevent the setup slack values from degrading into negative slack values that are worse than the worst negative slack value of any clock sink in the entire IC design. The worst setup slack of any clock sink in the current IC design, referred to as the design-worst setup slack, is -18 ps. Thus, the maximum increase 304 of the timing window 502 is 9 ps (because −9 ps can be lowered by 9 ps to −18 ps but no lower). The maximum decrease 308 of the timing window 502 is 15 ps (because −3 ps can be lowered by 15 ps to −18 ps but no lower).

The timing window 502 of FIG. 5 may be referred to as a worst negative slack (WNS) window, because it seeks to limit the worst negative slack of the entire IC design (e.g., the single worst negative slack value of any clock sink of the design) by ensuring that the worst slack value of any given clock sink does not degrade past the current design-worst slack value.

FIG. 3 and FIG. 4 thus provide a first approach (TNS), whereas FIG. 5 provides a second (WNS) approach, to defining timing windows for clock sinks to constrain clock timing adjustments made during the optimization stage of an iteration of CTS. In some examples, the optimization operations may be configured to not only satisfy these timing constraints but also to improve one or other parameters of the IC design (referred to herein as design parameters), such as power consumption or compliance with other design constraints or rules. For example, power consumption of the IC can be reduced, therefore improving battery life, by making various adjustments to the design, such as downsizing a clock instance so it uses less power and area, or moving a clock instance so the wire is shorter, thereby reducing capacitance and therefore power. Similarly, various design-rule constraint violations may be fixed during optimization, such as sizing and/or moving a clock instance or adding a new buffering clock instance if a wire capacitance or a signal transition time is outside of permitted limits. These optimization adjustments can affect clock timing, and are therefore constrained by the timing windows of the various clock sinks.

In some examples, an EDA system may perform CTS using TNS windows (as shown in FIG. 3 or FIG. 4) or WNS windows (as shown in FIG. 5). Assuming that the worst design slack is negative (which is typical prior to the completion of clock tree optimization), then all WNS windows will be larger than the corresponding TNS windows for each respective flip-flop. WNS and TNS windows each present various advantages and disadvantages during CTS.

One advantage of WNS windows is that they prevent degradation of design-worst slack. Another advantage of WNS windows is that they provide a greater degree of freedom for optimization, because during each CTS iteration, only two flip-flops in the entire design are constrained to zero delay-adjustment in one direction (e.g., only the two flip-flops that represent the worst path). This means that almost all flip-flops in the design have non-zero freedom to have their insertion delay adjusted up and/or down in the course of the optimization operations. However, one disadvantage of WNS windows is that the increased freedom they afford can lead to significant slack degradation for a given flip-flop, potentially resulting in significant TNS increase accumulated across all flip-flops. This means that if the WNS path is fixed during a given CTS iteration, the design may continue to exhibit a number of additional timing problems. Furthermore, the increased freedom afforded by WNS windows can lead to many paths degrading to negative slack values very close to those of the WNS path, such that, even if the original WNS path is fixed, the design-worst negative slack value may improve very little or not at all.

One advantage of TNS windows is that they do not increase the TNS of clock sinks across the design. This means that the problem of fixing negative slack is not made any harder during optimization. However, a disadvantage of TNS windows is that they are extremely restrictive, such that many flip-flops (specifically, all flip-flops on negative slack paths) have zero movement in at least one direction (increased or decreased insertion delay). In some cases, the flip-flops thus constrained could include over 10% of the design. This may effectively prevent the performance of many other optimizations, such as optimization operations targeting other design aspects such as power consumption or design-rule violations, because such operations would immediately cause violation of the TNS window constraints. In addition, may flip-flops have zero-sized TNS windows, meaning that their insertion delay cannot be adjusted in either direction. This happens for any flip-flop with negative slack on both input and output paths. These flip-flops are restricted even further such that any transform on (or near) these flops that makes even a minuscule delay change will be rejected.

Figure 6:
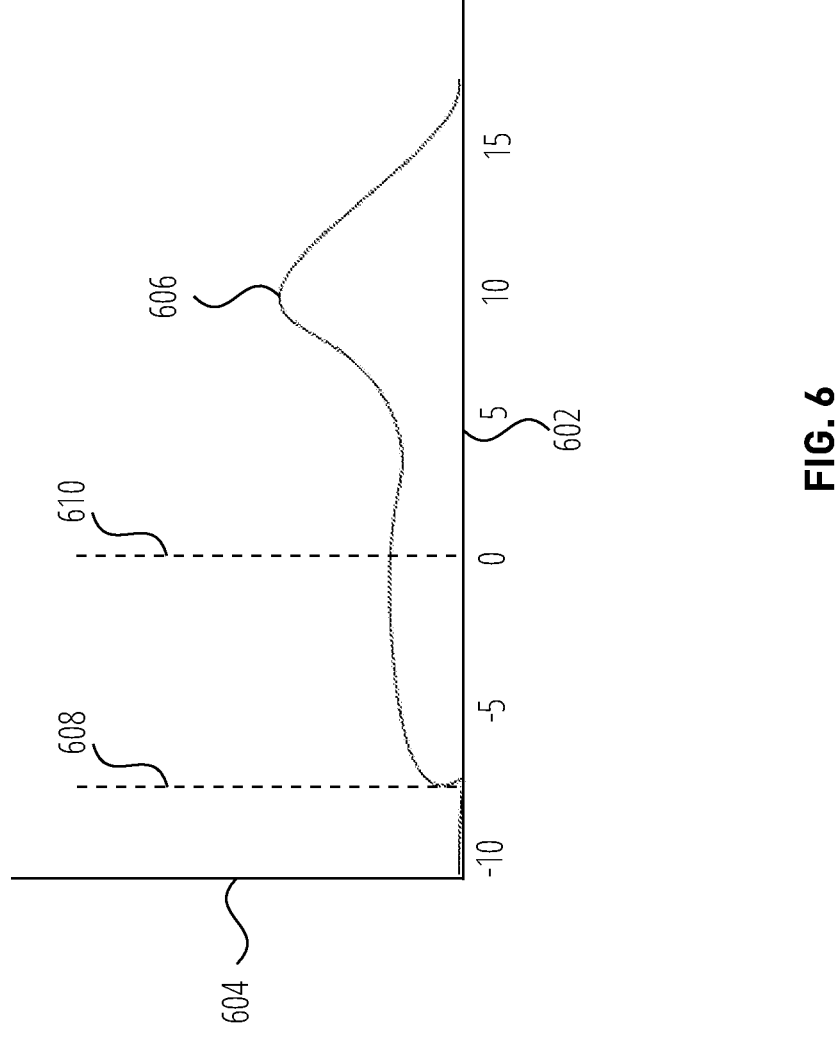
FIG. 6 illustrates a graph of the worst slack value of each flip-flop in an IC design prior to clock tree optimization, in accordance with some examples.
Figure 7:
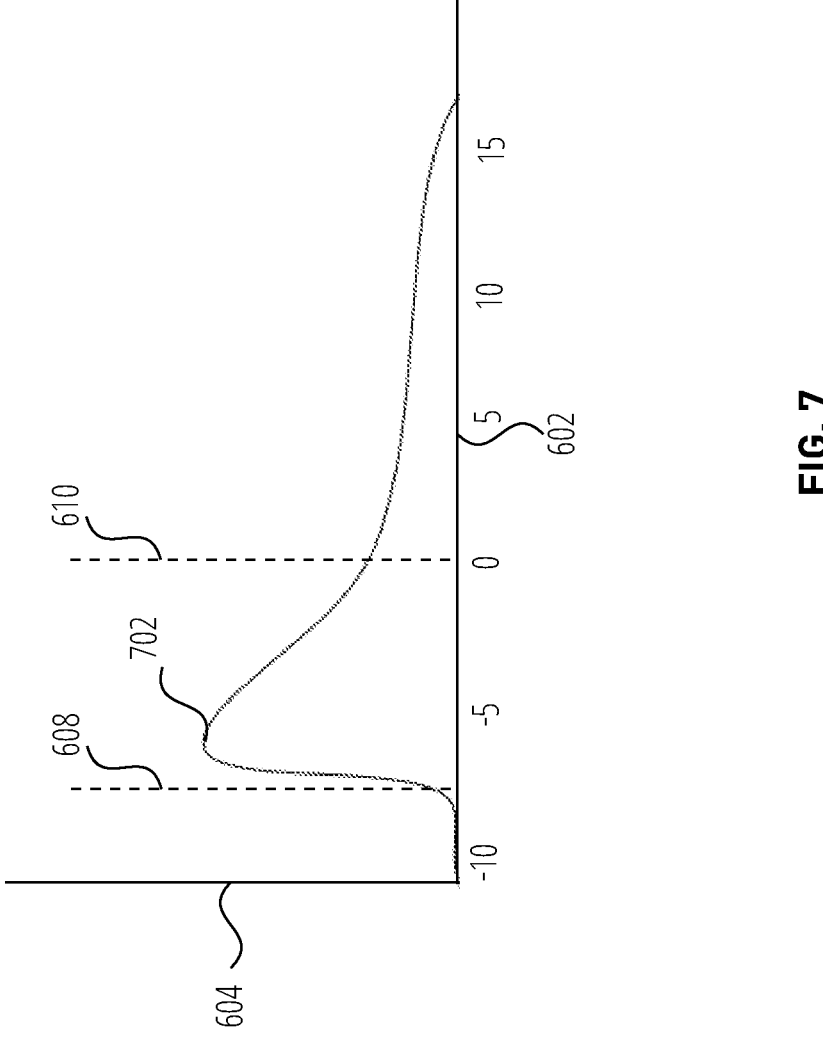
FIG. 7 illustrates the graph of FIG. 6 after multiple rounds of optimization using WNS windows, in accordance with some examples.
Figure 8:
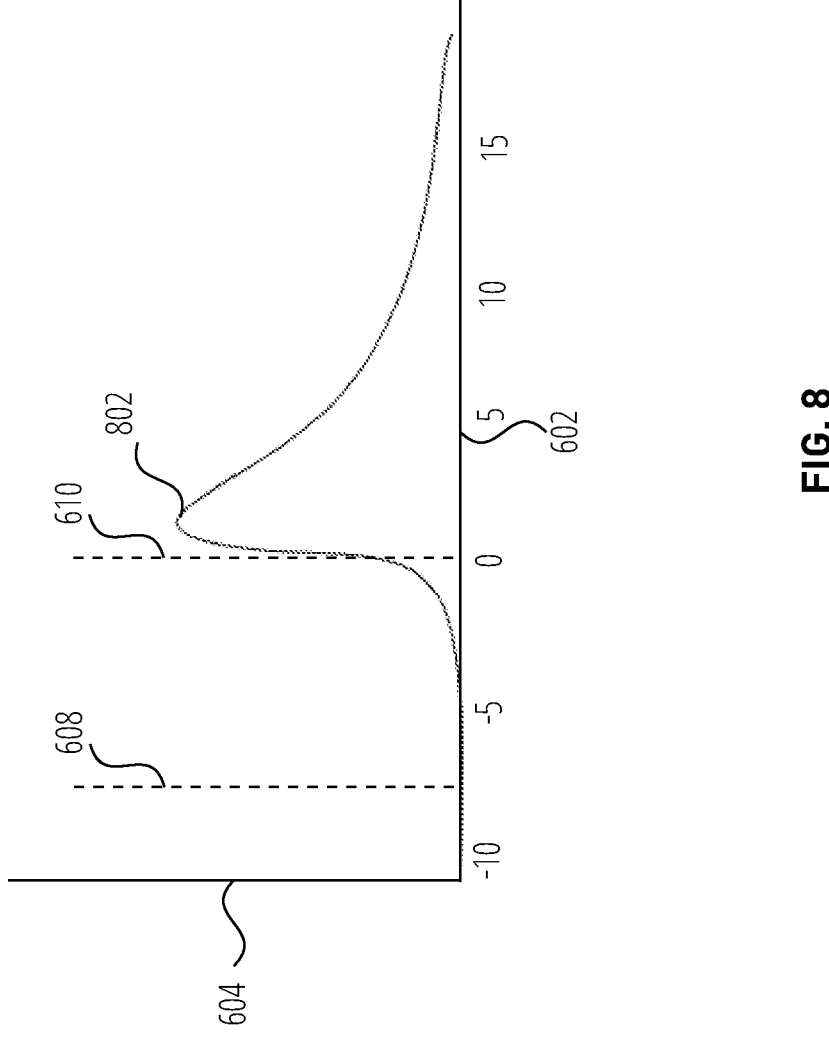
FIG. 8 illustrates the graph of FIG. 6 after multiple rounds of optimization using TNS windows, in accordance with some examples.

FIG. 6 through FIG. 8 show the effects of these different timing window types on flip-flop slack values during clock tree optimization and CTS.

FIG. 6 shows a graph of the worst slack value of each flip-flop in an IC design prior to clock tree optimization. The slack 602 of each flip-flop is shown as the horizontal axis, and the number of flip-flops 604 of each slack value is shown as the vertical axis. The flip-flops of the IC design have a range of worst slack values, ranging down to a design-worst slack 608, but peaking at a positive mode 606 above the zero slack 610 marker.

FIG. 7 shows the graph of FIG. 6 after several rounds of optimization using WNS windows. Because WNS windows allow each flip-flop to degrade to the design-worst slack 608, the flip-flops of the design now peak at a negative mode 702 that abuts the design-worst slack 608, below the zero slack 610 marker. The peak at mode 702 defines a discontinuity at the design-worst slack 608.

FIG. 8 shows the graph of FIG. 6 after several rounds of optimization using TNS windows. Because TNS windows allow each flip-flop having positive slack to degrade only down to zero slack, the flip-flops of the design now peak at a mode 802 that abuts the zero slack 610 marker. Whereas this means that the flip-flops tend to have more acceptable slack values, it also means that the optimization process cannot make adjustments that would push the flip-flops into the region of the graph between the design-worst slack 608 and the zero slack 610 marker. The peak at mode 802 defines a discontinuity at the zero slack 610 marker.

Due to the trade-offs inherent in the choice between WNS windows and TNS windows, examples described herein may provide an EDA system that uses hybrid timing windows combining aspects of both WNS and TNS windows. In some examples, a hybrid window scheme prescribes different timing window types for different flip-flops based on the initial configuration of positive and negative slack values of the flip-flop.

In some examples, the hybrid window scheme uses TNS windows for flip-flops having only positive slack on both sides, uses a combination of TNS and a local WNS variation (described below) for flip-flops having one positive and one negative side, and uses the local WNS variation for flip-flops having negative slack on both sides. Furthermore, in some examples, a minimum window size may be applied to flip-flops having positive slack, such that small window sizes are expanded to a minimum size, thereby smoothing out the discontinuities caused by WNS windows and TNS windows at the design-worst slack 608 and at zero slack 610, respectively.

A variant on WNS, referred to herein as local WNS, may be used to define timing windows for flip-flops having negative slack on one side or the other. Local WNS can be implemented according to various examples.

Figure 9:
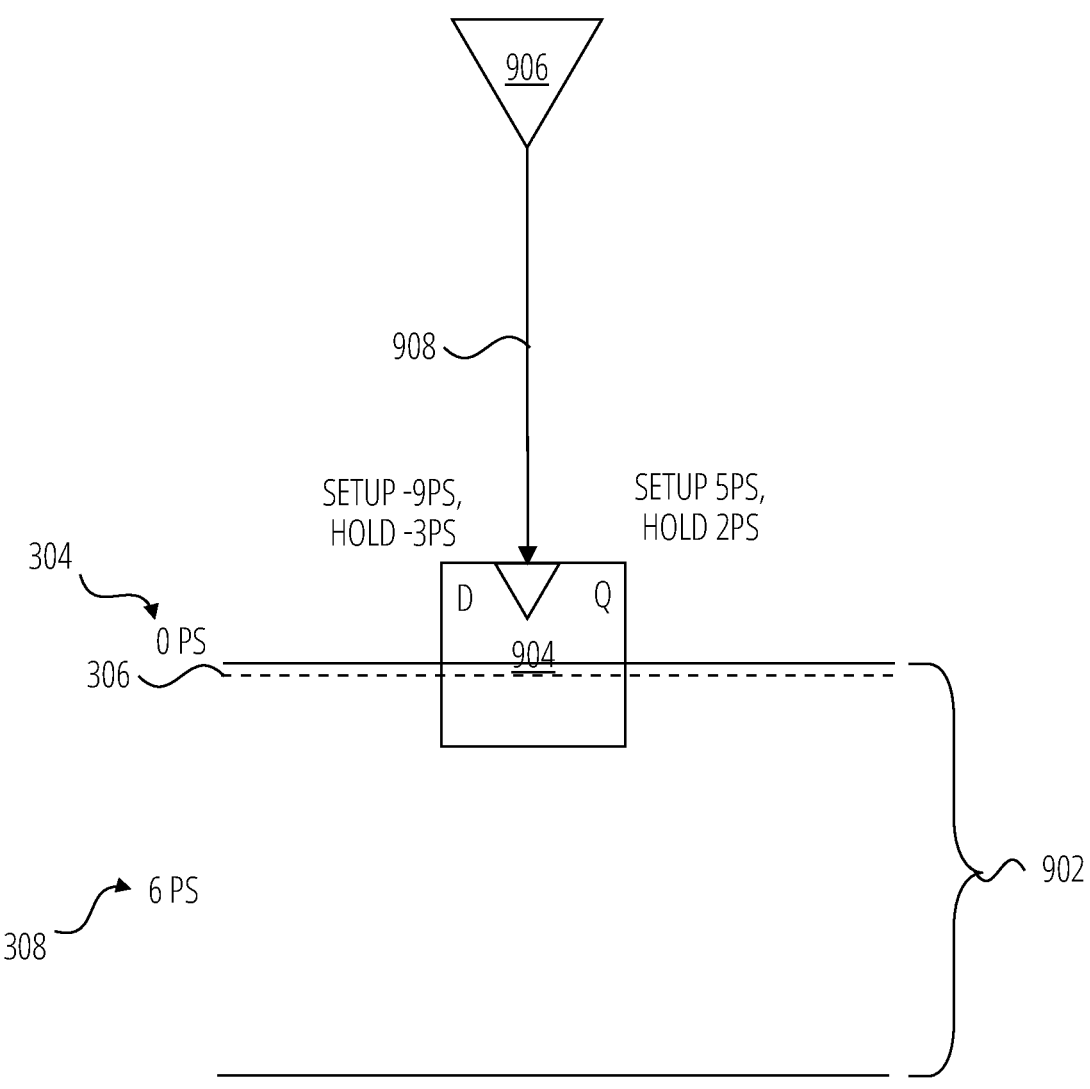
FIG. 9 illustrates a first example implementation of a local WNS timing window of a flip-flop, in accordance with some examples.

A first example implementation of local WNS accords with the approach shown in FIG. 9: any flip-flop with negative slack on both sides has a timing window defined for it such that neither side can degrade beyond the worst negative slack. E.g., in the example of FIG. 9, neither side (−3 ps or −9 ps) can degrade beyond the worst negative slack (−9 ps), thereby dictating a timing window 902 with a maximum increase 304 of 0 ps and a maximum decrease 308 of 6 ps.

FIG. 9 shows a timing window 902 defined according to a third approach to addressing negative slack problems. The flip-flop 904 has the same slack values as the flip-flop 404 of FIG. 4, and is clocked by local clock 908 defined by delay 906. In the approach of FIG. 9, the negative slack values are allowed to remain and be adjusted, as long as no negative slack value results from this adjustment of delay 906 that is lower than the lowest initial negative slack value. Thus, because the D-pin has a setup slack of −9 ps and a hold slack of −3 ps, the approach shown in FIG. 9 allows all negative slack values to be adjusted down to −9 ps but no lower. Thus, the maximum decrease 308 of the timing window 902 is 6 ps (because −3 ps can be lowered by 6 ps to −9 ps but no lower). The maximum increase 304 continues to be 0 ps, because any increase would make the D-pin setup hold slack value of −9 ps lower than the current lowest negative value (−9 ps) and is therefore disallowed.

Figure 10:
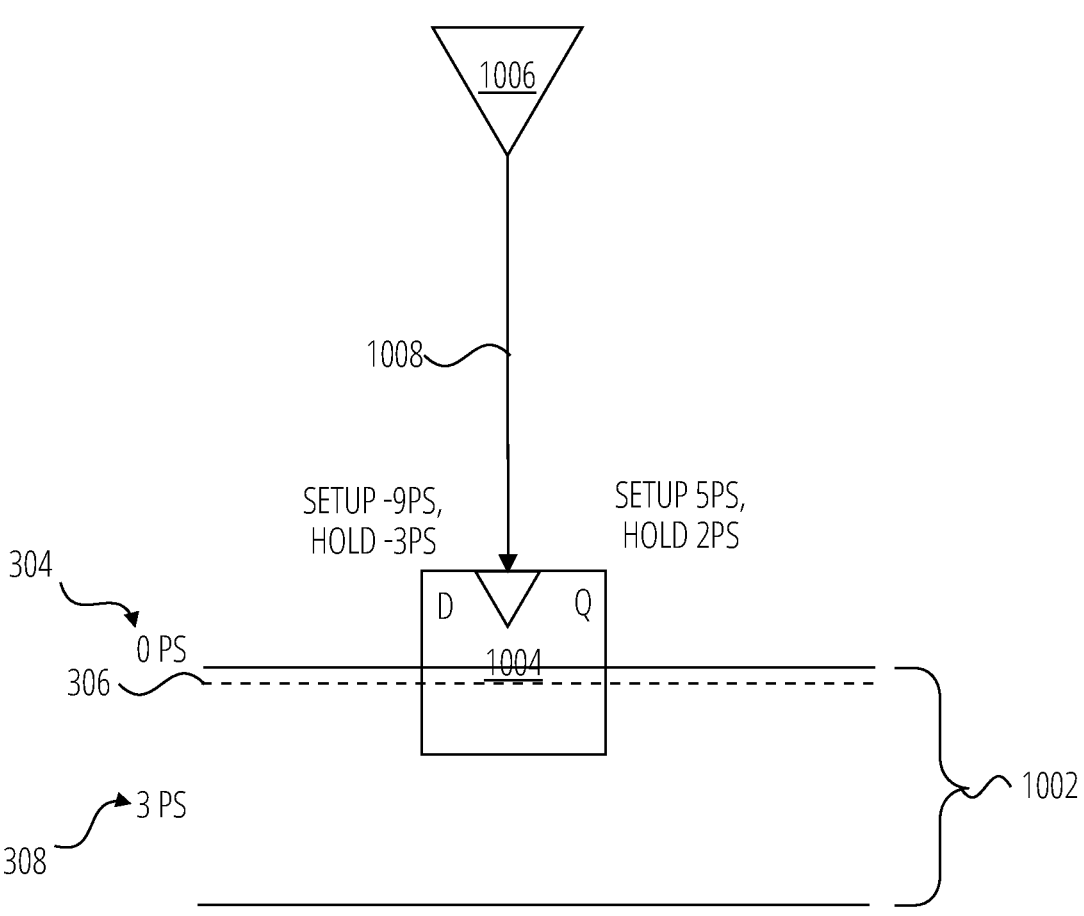
FIG. 10 illustrates a second example implementation of a local WNS timing window of a flip-flop, in accordance with some examples.

A second example implementation of local WNS accords with the approach shown in FIG. 10: any flip-flop with negative slack on both sides has a timing window defined for it such that the worse side cannot degrade further, and the better side cannot degrade past the balance point (e.g., the mean of the better and worse side). E.g., in the example of FIG. 10, the worse side (−9 ps) can degrade further, and the better side (−3 ps) cannot degrade past the balance point (−6 ps, the mean of −3 and −9), thereby dictating a timing window 1002 with a maximum increase 304 of 0 ps and a maximum decrease 308 of 3 ps.

FIG. 10 shows a timing window 1002 defined according to a second approach to addressing negative slack problems. The flip-flop 1004 has the same slack values as the flip-flop 404 of FIG. 4, and is clocked by local clock 1008 defined by delay 1006. In the approach of FIG. 10, the optimization process accepts that the negative slack problem exists, but simply aims to minimize the overall amount of negative slack at the flip-flop 1004. Thus, because the D-pin has a setup slack of −9 ps and a hold slack of −3 ps, the approach shown in FIG. 10 attempts to balance these two negative values by allowing both to be adjusted to −6 ps (e.g., the mean of −9 ps and −3 ps). Thus, the maximum decrease 308 of the timing window 1002 is 3 ps. The maximum increase 304 continues to be 0 ps, because any increase would make the lower negative slack value (D-pin setup hold −9 ps) even lower and is therefore disallowed. Thus, the approach of FIG. 10 allows the negative slack values to be adjusted to a point where they are balanced (e.g., to a mean value thereof), but not beyond this point. In other examples, the balance point may be defined as a different value between the lowest negative slack value and another negative slack value of the flip-flop, such as a weighted balance point based on multiple D-pins and/or multiple Q-pins involved in a timing path. For example, timing paths are often not limited to a single Q-pin to single D-pin: instead, the signal received by a D-pin may be computed based on the outputs of multiple Q-pins processed or combined by some combinational logic. Similarly, the signal output by a Q-pin may in part affect, through a logic circuit, multiple D-pins. Thus, in some examples, the balance point could be computed as a weighted mean based on the importance of the D-pins and Q-pins, where importance is based at least in part on how many timing paths each D-pin or Q0pin affects. In some examples, multi-bit flops may include multiple D pins passing to multiple Q pins in a single instance with a single clock; these multi-bit flops may also have a balance point defined based on an average or weighted average of the multiple D-pin and multiple Q-pin slack values.

It will be appreciated that, for a flip-flop having the design-worst slack (e.g., a flip-flop in the WNS path), its local WNS window will be identical to a WNS window (as shown in FIG. 5) for the first local WNS implementation described above.

The approaches of FIG. 9 and FIG. 10 can be extended by analogy to flip-flops having only a single negative slack value.

In some example hybrid window schemes, flip-flops having negative slack on one side and positive slack on the other side may apply the local WNS scheme to form the side having negative slack, such that the negative slack side must not degrade further. The side of the window having positive slack must remain positive, as in the case of a TNS window (as shown in FIG. 3). An example of such a window is shown in FIG. 11.

Figure 11:
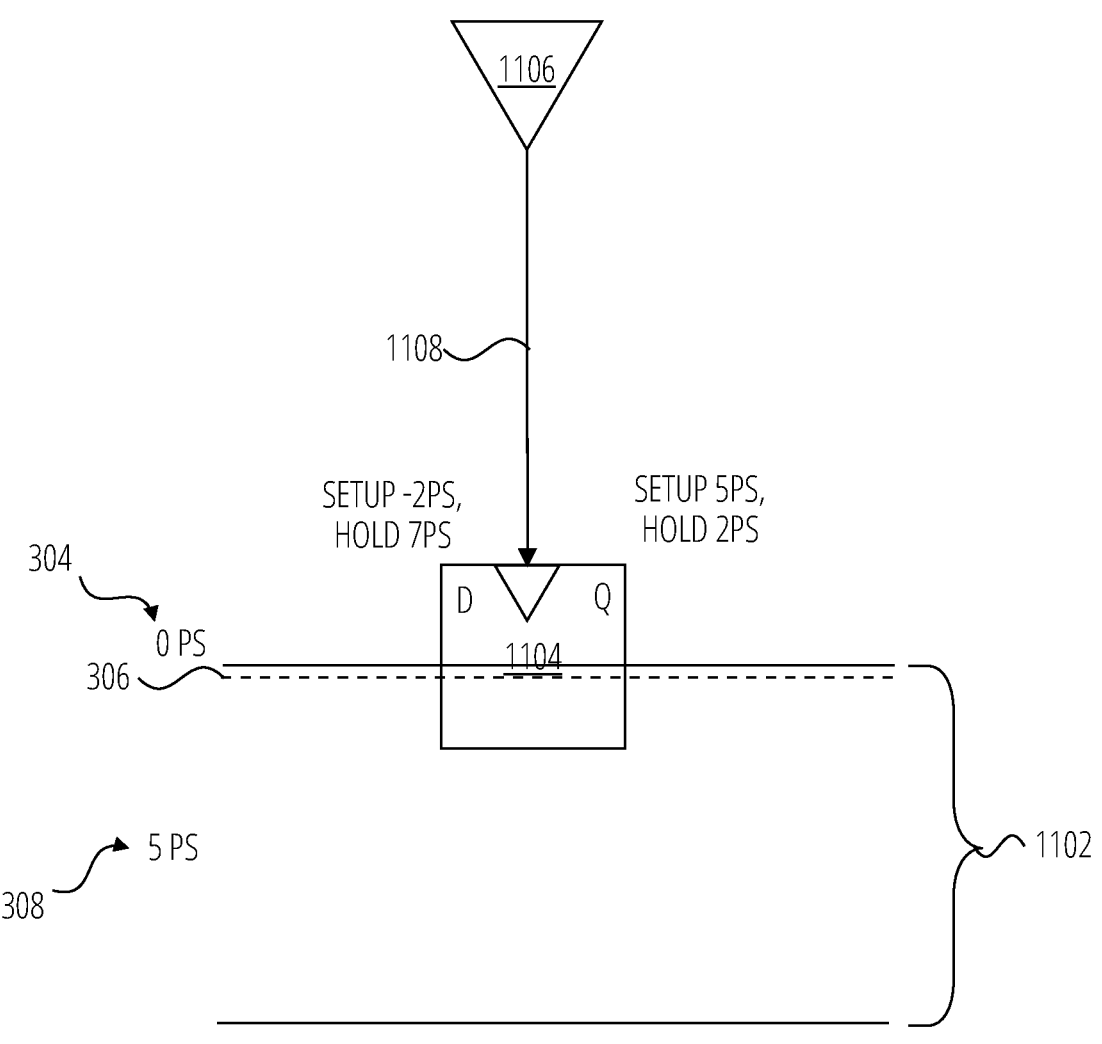
FIG. 11 illustrates a timing window for a flip-flop having only a single negative slack value, in accordance with some examples.

FIG. 11 shows a timing window 1102 for a flip-flop 1104 having only a single negative slack value, in accordance with an example hybrid window scheme. The D-pin of flip-flop 1104 has a setup slack of −2 picoseconds (ps) and a hold slack of 7 ps, and the Q-pin has the same slack values as FIG. 3 through FIG. 9 (setup slack of 5 ps and hold slack of 2 ps). The flip-flop 1104 is clocked by local clock 1108 defined by delay 1106.

In this example, the timing window 1102 is defined to prevent the positive slack values from degrading into negative slack values. Thus, the maximum decrease 308 of the timing window 1102 is 5 ps (because 5 ps can be lowered by 5 ps to 0 ps but no lower). The maximum increase 304 is 0 ps, because any increase would make the D-pin setup hold slack value of −2 ps lower than the current lowest negative value (−2 ps) and is therefore disallowed.

Returning to the hybrid window scheme: flip-flops having positive slack on both sides will use TNS windows (as shown in FIG. 3). Neither side may degrade past zero slack. It will be appreciated that these TNS windows may be very large (for large positive slack values) or very small (for very small positive slack values).

Thus, in some examples, a set of clock timing constraints is generated for the plurality of slack values of each flip-flop (e.g., a setup slack value and a hold slack value for the D-pin and the Q-pin of each flip-flop). The set of constraints for the plurality of slack values of a given flip-flop may be represented as a timing window. The constraints are generated such that every positive slack value of the plurality of slack values is prevented from becoming negative (e.g., a TNS window for flip-flops with positive slack values), a lowest negative slack value of the one or more negative slack values is prevented from becoming lower (e.g., a local WNS window for the lowest negative slack value of the flip-flop), and every negative slack value of the one or more negative slack values having a higher value than the lowest negative slack value is prevented from becoming lower than the lowest negative slack value but is allowed to become lower than its current value (e.g., either the first example implementation of FIG. 9 or the second example implementation of FIG. 10 of a local WNS window for other negative slack values of the flip-flop).

It will be appreciated that the hybrid window scheme causes a transition between TNS windows and local WNS windows at the zero slack 610 marker. In order to smooth this transition, and the resulting discontinuity as shown in FIG. 8, a minimum window size may be applied to windows in which one side has negative slack and the other side has a small positive slack value. A minimum window size may be a predetermined value, such as 3 ps, that expands windows having small positive slack values to have a maximum increase 304 and/or a maximum decrease 308 that is at least the minimum window size. This allows flip-flops close to the zero slack 610 to be pushed to the left of the zero slack 610 marker during optimization, thereby transitioning from a small positive value to a small negative value, and thereby smoothing out the discontinuity at zero slack 610. However, in some examples, the expansion of these TNS windows to the minimum window size is still constrained by the local WNS implementation being used, such that negative slack values cannot be degraded past the worst slack value or the balance point. An example of such a window is shown in FIG. 12.

In some examples, the minimum window size is computed based on properties of the circuit design, such that the minimum window size scales to the speed of the circuit. Different circuits, using different technologies, can run at different maximum speeds. In some examples, a circuit's maximum speed is evaluated by measuring the delay through a fastest available buffer. A simulation may be run wherein the fastest available buffer is connected into a simulated circuit and the time required to drive a signal change through a wire and into 4 driven buffers is measured. This technique can be used to determine a time factor that scales automatically with the type of circuit design. The minimum window size may be set based on the time factor, for example, by multiplying the time factor by a multiplier (e.g., 0.5 or 2.8). In some examples, the multiplier is a constant across all circuit designs.

Figure 12:
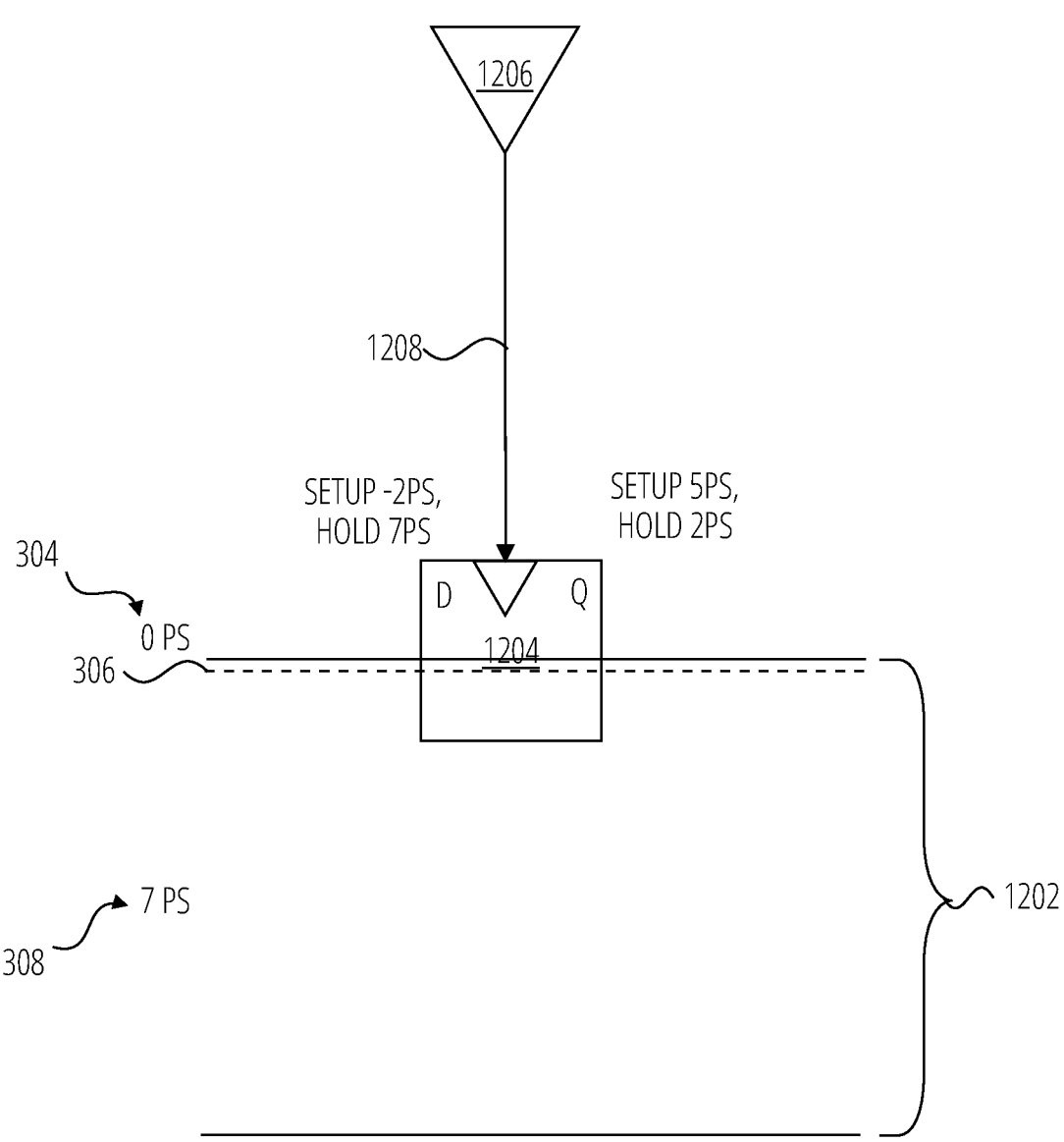
FIG. 12 illustrates a timing window for a flip-flop having the same slack values as the flip-flop of FIG. 11, but using a minimum window size to relax the constraints defined by the timing window, in accordance with some examples.

FIG. 12 shows a timing window 1202 for a flip-flop 1204 having the same slack values as FIG. 11, but using a minimum window size to relax the constraints defined by the timing window 1202. The flip-flop 1204 is clocked by local clock 1208 defined by delay 1206.

In this example, the timing window 1202 is defined to prevent the positive slack values from degrading into negative slack values that are worse than the initial worst negative slack value. Thus, the maximum decrease 308 of the timing window 1202 is 7 ps (because 5 ps can be lowered by 7 ps to −2 ps but no lower). The maximum increase 304 is 0 ps for the same reason as in FIG. 11.

It will be appreciated that, whereas the timing window is described herein as being expanded to a minimum window size, in some examples the relaxation of the clock timing constraints defined by the timing window may be computed during the initial generation of the timing window, rather than representing a separate calculation or modification of the timing window after it is initially generated. Any reference herein to expanding or relaxing the timing window or the constraints it represents may be understood to encompass such an initial computation of the timing window.

FIG. 13 illustrates an example method 1300 of CTS using hybrid timing windows. Although the example method 1300 depicts a particular sequence of operations, the sequence may be altered without departing from the scope of the present disclosure. For example, some of the operations depicted may be performed in parallel or in a different sequence that does not materially affect the function of the method 1300. In other examples, different components of an example device or system that implements the method 1300 may perform functions at substantially the same time or in a specific sequence. Although the method 1300 is described as being performed by EDA software executed by one or more processors of a computing system, it will be appreciated that one or more operations of the method 1300 may be performed by any suitable programmable logic.

At operation 1302, an IC design is accessed. The IC design includes a clock network including one or more flip-flops. In some examples, the IC design may be generated by a design process involving an initial design input operation in which the basic elements and functionality of a device are determined, as well as revisions based on various analyses and optimization of a circuit design. The design input operation may use block instances for the circuit design, and may involve selecting additional circuitry for the design around the blocks. The initial strategy, tactics, and context for the device to be created may also be generated as part of the design input operation, depending on the particular design algorithm to be used. The IC design may be accessed, e.g., by reading all or part of the IC design from a local or remote memory, and/or by receiving all or part of the IC design over a network communication link.

At operation 1304, a first iteration of CTS is performed to generate an intermediate clock tree. The intermediate clock tree is generated based on the clock network. The intermediate clock tree includes a respective insertion delay for each of the one of more flip-flops, such that each of the one of more flip-flops is associated with a plurality of slack values based at least in part on the insertion delay of the flip-flop.

In some examples, the plurality of slack values includes an input setup slack value, an output setup slack value, an input hold slack value, and an output hold slack value.

At operation 1306, a set of clock timing constraints is generated for the slack values of a flip-flop of the one of more flip-flops according to a hybrid window scheme. In some examples, as described above, the constraints are generated such that every positive slack value of the plurality of slack values is prevented from becoming negative, a lowest negative slack value of the one or more negative slack values is prevented from becoming lower, and every negative slack value of the one or more negative slack values having a higher value than the lowest negative slack value is prevented from becoming lower than the lowest negative slack value but is allowed to become lower than its current value.

Operation 1306 may be repeated for each flip-flop in the intermediate clock tree, such that a set of clock timing constraints is generated for the plurality of slack values of each of the one or more flip-flops.

In some examples, the set of clock timing constraints of a first flip-flop of the one or more flip-flops allows a first negative slack value of the one or more negative slack values having a higher value than the lowest negative slack value to become as low as the lowest negative slack value. For example, some flip-flops may have timing windows generated in accordance with the first example implementation of local WNS as shown in FIG. 9.

In some examples, the set of clock timing constraints of a first flip-flop of the one or more flip-flops allows a first negative slack value of the one or more negative slack values having a higher value than the lowest negative slack value to become as low as a balance point between the lowest negative slack value and the current value of the first negative slack value. For example, some flip-flops may have timing windows generated in accordance with the second example implementation of local WNS as shown in FIG. 10. In some examples, the balance point is computed as a mean of the lowest negative slack value and the current value of the first negative slack value.

In some examples, the set of clock timing constraints for each flip-flop, as generated at operation 1306, includes a timing window. The timing window can include a maximum increase and a maximum decrease for the insertion delay of the flip-flop. The maximum increase may be set equal to the lesser of the input setup slack value and the output setup slack value, and the maximum decrease may be set equal to the lesser of the input hold slack value and the output hold slack value.

At operation 1308, in some examples, the constraints of some flip-flops may be relaxed based on a minimum window size. For example, the constraints of the slack values of a first flip-flop of the one or more flip-flops may be relaxed such that a first positive slack value of the first flip-flop is allowed to become negative, but is prevented from becoming lower than a first negative value. The first negative value is based on a current value of the first positive slack value and a predetermined minimum window size. In some examples, the first positive slack value is selected based on its proximity to zero, as described above with reference to FIG. 12.

At operation 1310, a second iteration of CTS is performed, constrained by the clock timing constraints generated at operation 1306, to generate an enhanced clock tree. The second iteration of CTS may include various optimization operations, as described above. For example, performing the second iteration of CTS may include adjusting the insertion delays of the one or more flip-flops directly. In some examples, performing the second iteration of CTS may include adjusting design parameters affecting the insertion delays of the one or more flip-flops. The design parameters may include one or more design parameters affecting power consumption and/or one or more design parameters affecting compliance with one or more design rules, as described above.

At operation 1312, a layout instance is generated for the IC design based on the enhanced clock tree. In some examples, generating the layout instance for the IC design based on the enhanced clock tree may include performing one or more additional iterations of generating the constraints (e.g., operation 1306 repeated for each flip-flop) and performing CTS (e.g., operation 1310), as shown in FIG. 13. After the final iteration of CTS is complete, the layout instance may be generated based on the final enhanced clock tree.

In some examples, the layout instance generated at operation 1312 can serve as the basis for further design and/or fabrication operations in order to fabricate a finished IC. The layout instance may undergo various post-processing and/or verification operations, potentially including one or more additional iterations of CTS or other clock adjustment processes, before being finalized and used to inform the fabrication of the IC.

13

14

Machine Architecture

Figure 14:
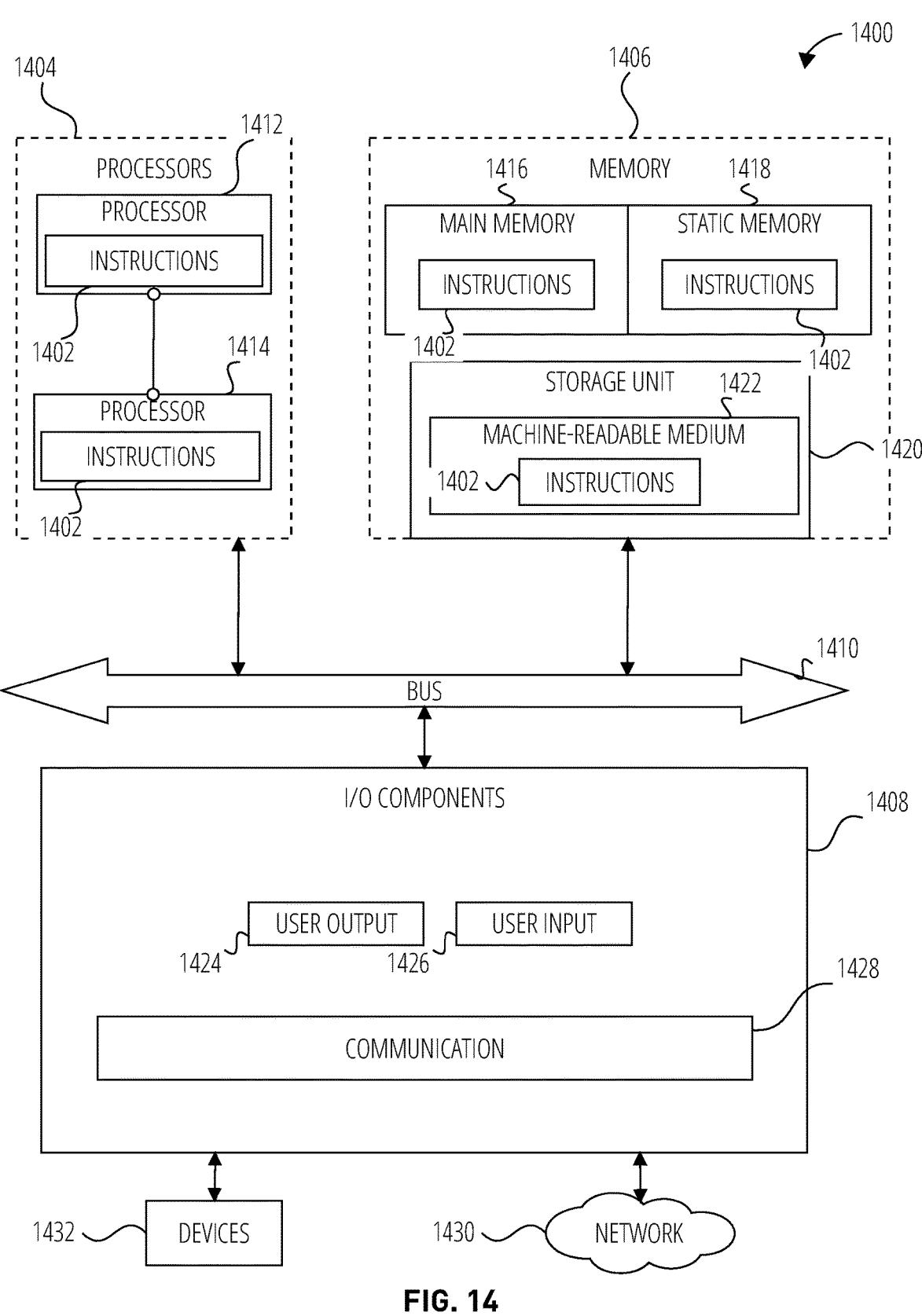
FIG. 14 is a diagrammatic representation of a machine in the form of a computer system within which a set of instructions may be executed to cause the machine to perform any one or more of the methodologies discussed herein, according to some examples.

FIG. 14 is a diagrammatic representation of the machine 1400 within which instructions 1402 (e.g., software, a program, an application, an applet, an app, or other executable code) for causing the machine 1400 to perform any one or more of the methodologies discussed herein may be executed. For example, the instructions 1402 may cause the machine 1400 to execute any one or more of the methods described herein. The instructions 1402 transform the general, non-programmed machine 1400 into a particular machine 1400 programmed to carry out the described and illustrated functions in the manner described. The machine 1400 may operate as a standalone device or may be coupled (e.g., networked) to other machines. In a networked deployment, the machine 1400 may operate in the capacity of a server machine or a client machine in a server-client network environment, or as a peer machine in a peer-to-peer (or distributed) network environment. The machine 1400 may comprise, but not be limited to, a server computer, a client computer, a personal computer (PC), a tablet computer, a laptop computer, a netbook, a set-top box (STB), a personal digital assistant (PDA), an entertainment media system, a cellular telephone, a smartphone, a mobile device, a wearable device (e.g., a smartwatch), a smart home device (e.g., a smart appliance), other smart devices, a web appliance, a network router, a network switch, a network bridge, or any machine capable of executing the instructions 1402, sequentially or otherwise, that specify actions to be taken by the machine 1400. Further, while a single machine 1400 is illustrated, the term "machine" shall also be taken to include a collection of machines that individually or jointly execute the instructions 1402 to perform any one or more of the methodologies discussed herein. In some examples, the machine 1400 may comprise both client and server systems, with certain operations of a particular method or algorithm being performed on the server-side and with certain operations of the particular method or algorithm being performed on the client-side.

The machine 1400 may include processors 1404, memory 1406, and input/output I/O components 1408, which may be configured to communicate with each other via a bus 1410. In an example, the processors 1404 (e.g., a Central Processing Unit (CPU), a Reduced Instruction Set Computing (RISC) Processor, a Complex Instruction Set Computing (CISC) Processor, a Graphics Processing Unit (GPU), a Digital Signal Processor (DSP), an Application Specific Integrated Circuit (ASIC), a Radio-Frequency Integrated Circuit (RFIC), another processor, or any suitable combination thereof) may include, for example, a processor 1412 and a processor 1414 that execute the instructions 1402. The term "processor" is intended to include multi-core processors that may comprise two or more independent processors (sometimes referred to as "cores") that may execute instructions contemporaneously. Although FIG. 14 shows multiple processors 1404, the machine 1400 may include a single processor with a single-core, a single processor with multiple cores (e.g., a multi-core processor), multiple processors with a single core, multiple processors with multiples cores, or any combination thereof.

The memory 1406 includes a main memory 1416, a static memory 1418, and a storage unit 1420, both accessible to the processors 1404 via the bus 1410. The main memory 1406, the static memory 1418, and storage unit 1420 store the instructions 1402 embodying any one or more of the methodologies or functions described herein. The instructions 1402 may also reside, completely or partially, within the main memory 1416, within the static memory 1418, within machine-readable medium 1422 within the storage unit 1420, within at least one of the processors 1404 (e.g., within the processor's cache memory), or any suitable combination thereof, during execution thereof by the machine 1400.

The I/O components 1408 may include a wide variety of components to receive input, provide output, produce output, transmit information, exchange information, capture measurements, and so on. The specific I/O components 1408 that are included in a particular machine will depend on the type of machine. For example, portable machines such as mobile phones may include a touch input device or other such input mechanisms, while a headless server machine will likely not include such a touch input device. It will be appreciated that the I/O components 1408 may include many other components that are not shown in FIG. 14. In various examples, the I/O components 1408 may include user output components 1424 and user input components 1426. The user output components 1424 may include visual components (e.g., a display such as a plasma display panel (PDP), a light-emitting diode (LED) display, a liquid crystal display (LCD), a projector, or a cathode ray tube (CRT)), acoustic components (e.g., speakers), haptic components (e.g., a vibratory motor, resistance mechanisms), other signal generators, and so forth. The user input components 1426 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and force of touches or touch gestures, or other tactile input components), audio input components (e.g., a microphone), and the like.

Communication may be implemented using a wide variety of technologies. The I/O components 1408 further include communication components 1428 operable to couple the machine 1400 to a network 1430 or devices 1432 via respective coupling or connections. For example, the communication components 1428 may include a network interface component or another suitable device to interface with the network 1430. In further examples, the communication components 1428 may include wired communication components, wireless communication components, cellular communication components, Near Field Communication (NFC) components, Bluetooth® components (e.g., Bluetooth® Low Energy), Wi-Fi® components, and other communication components to provide communication via other modalities. The devices 1432 may be another machine or any of a wide variety of peripheral devices (e.g., a peripheral device coupled via a USB).

Moreover, the communication components 1428 may detect identifiers or include components operable to detect identifiers. For example, the communication components 1428 may include Radio Frequency Identification (RFID) tag reader components, NFC smart tag detection components, optical reader components (e.g., an optical sensor to detect one-dimensional bar codes such as Universal Product Code (UPC) bar code, multi-dimensional bar codes such as Quick Response (QR) code, Aztec code, Data Matrix, Dataglyph™, MaxiCode, PDF417, Ultra Code, UCC RSS-2D bar code, and other optical codes), or acoustic detection components (e.g., microphones to identify tagged audio signals). In addition, a variety of information may be derived via the communication components 1428, such as location via Internet Protocol (IP) geolocation, location via Wi-Fi® signal triangulation, location via detecting an NFC beacon signal that may indicate a particular location, and so forth.

The various memories (e.g., main memory 1416, static memory 1418, and memory of the processors 1404) and storage unit 1420 may store one or more sets of instructions and data structures (e.g., software) embodying or used by any one or more of the methodologies or functions described herein. These instructions (e.g., the instructions 1402), when executed by processors 1404, cause various operations to implement the disclosed examples.

The instructions 1402 may be transmitted or received over the network 1430, using a transmission medium, via a network interface device (e.g., a network interface component included in the communication components 1428) and using any one of several well-known transfer protocols (e.g., hypertext transfer protocol (HTTP)). Similarly, the instructions 1402 may be transmitted or received using a transmission medium via a coupling (e.g., a peer-to-peer coupling) to the devices 1432.

Conclusion

Examples described herein may provide methods, systems, and computer readable media for CTS using a hybrid window scheme for defining timing windows during CTS. By combining certain aspects of WNS and TNS timing windows, examples described herein may attempt to address one or more technical problems related to clock timing constraints imposed during CTS using either WNS windows or TNS windows. In some examples, a hybrid window scheme as described herein may provide a better overall slack picture (e.g., a more compliant set of slack values across the flip-flops of the IC design) than schemes using WNS windows, while still preserving a substantial amount of freedom to perform other transforms and optimization operations during CTS. In some examples, a hybrid window scheme as described herein may provide more freedom for optimization than schemes using TNS windows, while still preserving a substantial amount of non-negative slack across the flip-flops of the IC design. In some examples, a hybrid window scheme as described herein may provide improvement in the overall design quality of the IC through better trade-offs for timing window sizes.

Other technical features may be readily apparent to one skilled in the art from the following figures, descriptions, and claims.

Glossary

"D-pin" refers to an input pin of a flip-flop. D-pin, D pin, or input pin may also refer more generally to an input gate or port of a clocked component.

"Q-pin" refers to an output pin of a flip-flop. Q-pin, Q pin, or output pin may also refer more generally to an output gate or port of a clocked component.

"Low" (as well as "lower", "lowest", etc.) refers, in the context of a numerical value, to a number lying to the left of a reference point on a number line. Thus, a first negative value (e.g., −5) having a greater absolute value than a second negative number (e.g., −2) is said to be lower than the second negative number. Similarly, a small positive number (or any zero or negative number) is said to be lower than a larger positive number. Similarly, the terms "high", "higher", and "highest" mean the opposite of "low", "lower", and "lowest", respectively.

"Client device" refers, for example, to any machine that interfaces to a communications network to obtain resources from one or more server systems or other client devices. A client device may be, but is not limited to, a mobile phone, desktop computer, laptop, portable digital assistants (PDAs), smartphones, tablets, ultra-books, netbooks, laptops, multi-processor systems, microprocessor-based or programmable consumer electronics, game consoles, set-top boxes, or any other communication device that a user may use to access a network.

"Communication network" refers, for example, to one or more portions of a network that may be an ad hoc network, an intranet, an extranet, a virtual private network (VPN), a local area network (LAN), a wireless LAN (WLAN), a wide area network (WAN), a wireless WAN (WWAN), a metropolitan area network (MAN), the Internet, a portion of the Internet, a portion of the Public Switched Telephone Network (PSTN), a plain old telephone service (POTS) network, a cellular telephone network, a wireless network, a Wi-Fi® network, another type of network, or a combination of two or more such networks. For example, a network or a portion of a network may include a wireless or cellular network, and the coupling may be a Code Division Multiple Access (CDMA) connection, a Global System for Mobile communications (GSM) connection, or other types of cellular or wireless coupling. In this example, the coupling may implement any of a variety of types of data transfer technology, such as Single Carrier Radio Transmission Technology (1×RTT), Evolution-Data Optimized (EVDO) technology, General Packet Radio Service (GPRS) technology, Enhanced Data rates for GSM Evolution (EDGE) technology, third Generation Partnership Project (3GPP) including 3G, fourth-generation wireless (4G) networks, Universal Mobile Telecommunications System (UMTS), High Speed Packet Access (HSPA), Worldwide Interoperability for Microwave Access (WiMAX), Long Term Evolution (LTE) standard, others defined by various standard-setting organizations, other long-range protocols, or other data transfer technology. The term "network", as used herein, shall refer to a communication network unless otherwise indicated.

"Component" refers, for example, to a device, physical entity, or logic having boundaries defined by function or subroutine calls, branch points, APIs, or other technologies that provide for the partitioning or modularization of particular processing or control functions. Components may be combined via their interfaces with other components to carry out a machine process. A component may be a packaged functional hardware unit designed for use with other components and a part of a program that usually performs a particular function of related functions. Components may constitute either software components (e.g., code embodied on a machine-readable medium) or hardware components. A "hardware component" is a tangible unit capable of performing certain operations and may be configured or arranged in a certain physical manner. In various examples, one or more computer systems (e.g., a stand-alone computer system, a client computer system, or a server computer system) or one or more hardware components of a computer system (e.g., a processor or a group of processors) may be configured by software (e.g., an application or application portion) as a hardware component that operates to perform certain operations as described herein. A hardware component may also be implemented mechanically, electronically, or any suitable combination thereof. For example, a hardware component may include dedicated circuitry or logic that is permanently configured to perform certain operations. A hardware component may be a special-purpose processor, such as a field-programmable gate array (FPGA) or an application-specific integrated circuit (ASIC). A hardware component may also include programmable logic or circuitry that is temporarily configured by software to perform certain operations. For example, a hardware component may include software executed by a general-purpose processor or other programmable processors. Once configured by such software, hardware components become specific machines (or specific components of a machine) uniquely tailored to perform the configured functions and are no longer general-purpose processors. It will be appreciated that the decision to implement a hardware component mechanically, in dedicated and permanently configured circuitry, or in temporarily configured circuitry (e.g., configured by software), may be driven by cost and time considerations. Accordingly, the phrase "hardware component" (or "hardware-implemented component") should be understood to encompass a tangible entity, be that an entity that is physically constructed, permanently configured (e.g., hardwired), or temporarily configured (e.g., programmed) to operate in a certain manner or to perform certain operations described herein. Considering examples in which hardware components are temporarily configured (e.g., programmed), each of the hardware components need not be configured or instantiated at any one instance in time. For example, where a hardware component comprises a general-purpose processor configured by software to become a special-purpose processor, the general-purpose processor may be configured as respectively different special-purpose processors (e.g., comprising different hardware components) at different times. Software accordingly configures a particular processor or processors, for example, to constitute a particular hardware component at one instance of time and to constitute a different hardware component at a different instance of time. Hardware components can provide information to, and receive information from, other hardware components. Accordingly, the described hardware components may be regarded as being communicatively coupled. Where multiple hardware components exist contemporaneously, communications may be achieved through signal transmission (e.g., over appropriate circuits and buses) between or among two or more of the hardware components. In examples in which multiple hardware components are configured or instantiated at different times, communications between such hardware components may be achieved, for example, through the storage and retrieval of information in memory structures to which the multiple hardware components have access. For example, one hardware component may perform an operation and store the output of that operation in a memory device to which it is communicatively coupled. A further hardware component may then, at a later time, access the memory device to retrieve and process the stored output. Hardware components may also initiate communications with input or output devices, and can operate on a resource (e.g., a collection of information). The various operations of example methods described herein may be performed, at least partially, by one or more processors that are temporarily configured (e.g., by software) or permanently configured to perform the relevant operations. Whether temporarily or permanently configured, such processors may constitute processor-implemented components that operate to perform one or more operations or functions described herein. As used herein, "processor-implemented component" refers to a hardware component implemented using one or more processors. Similarly, the methods described herein may be at least partially processor-implemented, with a particular processor or processors being an example of hardware. For example, at least some of the operations of a method may be performed by one or more processors or processor-implemented components. Moreover, the one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., an API). The performance of certain of the operations may be distributed among the processors, not only residing within a single machine, but deployed across a number of machines. In some examples, the processors or processor-implemented components may be located in a single geographic location (e.g., within a home environment, an office environment, or a server farm). In other examples, the processors or processor-implemented components may be distributed across a number of geographic locations.

"Computer-readable storage medium" refers, for example, to both machine-storage media and transmission media. Thus, the terms include both storage devices/media and carrier waves/modulated data signals. The terms "machine-readable medium," "computer-readable medium" and "device-readable medium" mean the same thing and may be used interchangeably in this disclosure.

"Machine storage medium" refers, for example, to a single or multiple storage devices and media (e.g., a centralized or distributed database, and associated caches and servers) that store executable instructions, routines and data. The term shall accordingly be taken to include, but not be limited to, solid-state memories, and optical and magnetic media, including memory internal or external to processors. Specific examples of machine-storage media, computer-storage media and device-storage media include non-volatile memory, including by way of example semiconductor memory devices, e.g., erasable programmable read-only memory (EPROM), electrically erasable programmable read-only memory (EEPROM), FPGA, and flash memory devices; magnetic disks such as internal hard disks and removable disks; magneto-optical disks; and CD-ROM and DVD-ROM disks The terms "machine-storage medium," "device-storage medium," "computer-storage medium" mean the same thing and may be used interchangeably in this disclosure. The terms "machine-storage media," "computer-storage media," and "device-storage media" specifically exclude carrier waves, modulated data signals, and other such media, at least some of which are covered under the term "signal medium."

"Non-transitory computer-readable storage medium" refers, for example, to a tangible medium that is capable of storing, encoding, or carrying the instructions for execution by a machine.

"Signal medium" refers, for example, to any intangible medium that is capable of storing, encoding, or carrying the instructions for execution by a machine and includes digital or analog communications signals or other intangible media to facilitate communication of software or data. The term "signal medium" shall be taken to include any form of a modulated data signal, carrier wave, and so forth. The term "modulated data signal" means a signal that has one or more of its characteristics set or changed in such a matter as to encode information in the signal. The terms "transmission medium" and "signal medium" mean the same thing and may be used interchangeably in this disclosure.

"User device" refers, for example, to a device accessed, controlled or owned by a user and with which the user interacts perform an action, or an interaction with other users or computer systems.

What is claimed is:

1. A system comprising:
one or more processors; and
a computer-readable storage medium storing instructions, which when executed by the one or more processors, cause the system to perform operations comprising:
   accessing a circuit design comprising a clock network that comprises a flip-flop;
   performing a first iteration of clock tree synthesis to generate an intermediate clock tree based on the clock network, the intermediate clock tree comprising an insertion delay for the flip-flop, such that the flip-flop is associated with a plurality of slack values based at least in part on the insertion delay of the flip-flop;
   generating a set of clock timing constraints for the plurality of slack values of the flip-flop such that:
      every positive slack value of the plurality of slack values is prevented from becoming negative; and
      if the plurality of slack values comprises one or more negative slack values:
         a lowest negative slack value of the one or more negative slack values is prevented from becoming lower; and
         every individual negative slack value of the one or more negative slack values having a higher value than the lowest negative slack value is prevented from becoming lower than the lowest negative slack value but is allowed to become lower than a current value of the individual negative slack value;
   performing a second iteration of clock tree synthesis constrained by the set of clock timing constraints, the performing of the second iteration of clock tree synthesis resulting in an enhanced clock tree; and
   generating a layout instance for the circuit design based on the enhanced clock tree.

2. The system of claim 1, wherein:
the set of clock timing constraints of the flip-flop allows a first negative slack value of the one or more negative slack values having a higher value than the lowest negative slack value to become as low as the lowest negative slack value.

3. The system of claim 1, wherein:
the set of clock timing constraints of the flip-flop allows a first negative slack value of the one or more negative slack values having a higher value than the lowest negative slack value to become as low as a balance point between the lowest negative slack value and a current value of the first negative slack value.

4. The system of claim 3, wherein:
the balance point is a mean of the lowest negative slack value and a current value of the first negative slack value.

5. The system of claim 1, wherein:
the plurality of slack values comprises:
   an input setup slack value;
   an output setup slack value;
   an input hold slack value; and
   an output hold slack value.

6. The system of claim 5, wherein:
the set of clock timing constraints for the flip-flop comprises a timing window.

7. The system of claim 6, wherein:
the timing window comprises a maximum increase and a maximum decrease for the insertion delay of the flip-flop.

8. The system of claim 7, wherein:
the maximum increase is equal to a lesser of the input setup slack value and the output setup slack value; and
the maximum decrease is equal to a lesser of the input hold slack value and the output hold slack value.

9. The system of claim 1, wherein the instructions further cause the system to, prior to performing the second iteration of clock tree synthesis:
   relax the set of clock timing constraints, such that a first positive slack value of the flip-flop is allowed to become negative but prevented from becoming lower than a first negative value, the first negative value being determined based on a current value of the first positive slack value and a predetermined minimum window size.

10. The system of claim 9, wherein:
the first positive slack value is selected based on its proximity to zero.

11. The system of claim 1, wherein:
performing the second iteration of clock tree synthesis comprises adjusting the insertion delay of the flip-flop.

12. The system of claim 1, wherein:
performing the second iteration of clock tree synthesis comprises adjusting design parameters affecting the insertion delay of the flip-flop.

13. The system of claim 12, wherein:
the design parameters comprise one or more design parameters affecting power consumption.

14. The system of claim 12, wherein:
the design parameters comprise one or more design parameters affecting compliance with one or more design rules.

15. The system of claim 1, wherein:
generating the layout instance for the circuit design based on the enhanced clock tree comprises performing one or more additional iterations of generating constraints and performing clock tree synthesis.

16. A method comprising:
accessing a circuit design comprising a clock network that comprises a flip-flop;
performing a first iteration of clock tree synthesis to generate an intermediate clock tree based on the clock network, the intermediate clock tree comprising a insertion delay for the flip-flop, such that the flip-flop is associated with a plurality of slack values based at least in part on the insertion delay of the flip-flop;
generating a set of clock timing constraints for the plurality of slack values of the flip-flop such that:

every positive slack value of the plurality of slack values is prevented from becoming negative; and if the plurality of slack values comprises one or more negative slack values:

a lowest negative slack value of the one or more negative slack values is prevented from becoming lower; and every individual negative slack value of the one or more negative slack values having a higher value than the lowest negative slack value is prevented from becoming lower than the lowest negative slack value but is allowed to become lower than a current value of the individual negative slack value;

performing a second iteration of clock tree synthesis constrained by the set of clock timing constraints, the performing of the second iteration of clock tree synthesis resulting in an enhanced clock tree; and generating a layout instance for the circuit design based on the enhanced clock tree.

17. The method of claim 16, wherein:

the set of clock timing constraints of the flip-flop allows a first negative slack value of the one or more negative slack values having a higher value than the lowest negative slack value to become as low as the lowest negative slack value.

18. The method of claim 16, wherein:

the set of clock timing constraints of the flip-flop allows a first negative slack value of the one or more negative slack values having a higher value than the lowest negative slack value to become as low as a balance point between the lowest negative slack value and a current value of the first negative slack value.

19. The method of claim 16, further comprising, prior to performing the second iteration of CTS:

relaxing the set of constraints for the flip-flop, such that a first positive slack value of the flip-flop is allowed to become negative but prevented from becoming lower than a first negative value, the first negative value being determined based on a current value of the first positive slack value and a predetermined minimum window size.

20. A non-transitory computer-readable storage medium, the computer-readable storage medium comprising instructions that when executed by one or more processors of a system, cause the system to perform operations comprising:

accessing a circuit design comprising a clock network that comprises a flip-flop;

performing a first iteration of clock tree synthesis to generate an intermediate clock tree based on the clock network, the intermediate clock tree comprising an insertion delay for the flip-flop, such that the flip-flop is associated with a plurality of slack values based at least in part on the insertion delay of the flip-flop;

generating a set of clock timing constraints for the plurality of slack values of the flip-flop such that:

every positive slack value of the plurality of slack values is prevented from becoming negative; and if the plurality of slack values comprises one or more negative slack values:

a lowest negative slack value of the one or more negative slack values is prevented from becoming lower; and every individual negative slack value of the one or more negative slack values having a higher value than the lowest negative slack value is prevented from becoming lower than the lowest negative slack value but is allowed to become lower than a current value of the individual negative slack value;

performing a second iteration of clock tree synthesis constrained by the set of clock timing constraints, the performing of the second iteration of clock tree synthesis resulting in an enhanced clock tree; and generating a layout instance for the circuit design based on the enhanced clock tree.

* * * * *